(12) United States Patent
Gerald, II et al.

(10) Patent No.: US 6,674,283 B2
(45) Date of Patent: Jan. 6, 2004

(54) NUCLEAR MAGNETIC RESONANCE IMAGING APPARATUS

(75) Inventors: Rex E. Gerald, II, Brookfield, IL (US); Robert J. Klingler, Westmont, IL (US); Jerome W. Rathke, Lockport, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 10/247,869

(22) Filed: Sep. 20, 2002

(65) Prior Publication Data

US 2003/0016019 A1 Jan. 23, 2003

Related U.S. Application Data

(62) Division of application No. 09/631,156, filed on Aug. 3, 2000, now Pat. No. 6,469,507.

(51) Int. Cl.[7] .................................................. G01V 3/00
(52) U.S. Cl. ........................................ 324/318; 324/322
(58) Field of Search ................................ 324/318, 322, 324/307, 309, 320, 300; 128/653.5

(56) References Cited

U.S. PATENT DOCUMENTS

| 5,045,793 | A | 9/1991 | Rathke | 324/318 |
|---|---|---|---|---|
| 5,574,370 | A | 11/1996 | Woelk et al. | 324/318 |
| 6,046,592 | A | 4/2000 | Rathke et al. | 324/318 |
| 6,191,583 | B1 | 2/2001 | Gerald, II et al. | |
| 6,469,507 | B1 | * 10/2002 | Gerald, II et al. | 324/318 |

* cited by examiner

Primary Examiner—Diego Gutierrez
Assistant Examiner—Brij B. Shrivastav
(74) Attorney, Agent, or Firm—Joan Pennington

(57) ABSTRACT

Imaging apparatus are used in a toroid cavity detector for nuclear magnetic resonance (NMR) analysis to hold samples relative to a principal detector element which is a flat metal conductor, the plane of which is parallel to the longitudinal axis of the toroid cavity. A sample is held adjacent to or in contact with the principal detector element so that the sample can be subjected to NMR analysis when a static main homogeneous magnetic field ($B_0$) produced by a NMR magnetic device is applied to the toroid cavity and an RF excitation signal pulse is supplied from a potentiostat to the principal detector element so that an alternately energized and de-energized magnetic field ($B_1$) is produced in the sample and through the toroid cavity. The sample may be components of a coin cell battery which are mounted within the toroid cavity relative to the principal detector element by an non-conductive coin cell battery imager or a press assembly so that the components are hermetically sealed together and so that a direct current potential can be applied to the components. Alternately, a sample is positioned within an O-ring maintained relative to the principal detector element by a pair of glass plates that are disposed on opposite sides of the principal detector element and are compressed toward each other so that NMR analysis can be used to analyze light transmitted through the sample or to analyze a sample separated from the principal detector element by semi-permeable membranes.

24 Claims, 12 Drawing Sheets

NUCLEAR MAGNETIC RESONANCE IMAGING APPARATUS

This application is a divisional application of Ser. No. 09/631,156 filed on Aug. 3, 2000 now U.S. Pat. No. 6,469,507.

CONTRACTUAL ORIGIN OF THE INVENTION

The United States Government has rights in this invention pursuant to Contract No. W-31-109-ENG-38 between the United States and The University of Chicago.

BACKGROUND OF THE INVENTION

1. Field of the Invention

The present invention relates to an apparatus used in nuclear magnetic resonance (NMR) imaging, and more particularly, to a new and improved imager for use in a toroid cavity detector so that in situ magnetic resonance analysis can be accomplished of samples such as battery components, membranes and thin film materials.

2. Background of the Invention

Nuclear magnetic resonance (NMR) techniques have been used as a nondestructive assay (NDA) of various materials. One NMR technique that has been used involves a toroid cavity probe. This technique enables the determination of both the presence and quantity of individual elements as well as full chemical-shift resolution (i.e., chemical speciation). For example, the toroid cavity probe has been used to determine the presence of hydrogen in materials and as to whether hydrogen is bound with oxygen (water) or another element such as a salt. At the same time, protons in other forms, such as hydrides, hydrates and acids, also are detectable and quantifiable. The ability to make such determinations and the sensitivity of toroid-based NMR imaging makes this type of technique ideal for analyzing certain types of material particularly when the materials are in disposed in various types of packaging or containers.

In one type of toroid cavity detector, a sample to be analyzed is placed in the toroid cavity and the toroid cavity is placed in an externally applied static main homogeneous magnetic field ($B_0$). The presence of the $B_0$ field causes the magnetic moments of a targeted class of nuclei in the sample to precess about the field's axis at a rate which is dependent on the magnetic field strength. Another magnetic field ($B_1$) is produced that is perpendicular to the $B_0$ field and is alternately energized and de-energized within the cavity. In the case where the $B_1$ field is produced by a radio frequency (RF) transmitter pulse applied to a wire or rod (working electrode) extending along the central axis of the cavity, the net sample magnetization is caused to rotate about the $B_1$ field axis. Following the RF pulse, the response of the sample to the applied field is detected and in most applications, received signals from the energized nuclei serve as input signals for spectroscopic analysis of the sample.

One of the unique features of the toroid cavity detector compared to some other types of detectors is the full containment of the RF magnetic field flux that is generated when the working electrode is pulsed with an RF current. As a result, the RF magnetic field flux that emanates from a sample contained within the toroid cavity and subjected to an excitation pulse of electromagnetic radiation is completely captured (i.e., detected). This feature makes the toroid cavity detector two to four times more sensitive to weak nuclear resonance signals than conventional coil resonators and allows a quantitative measurement of the total number of NMR-active nuclear spins in the sample, not possible with other types of NMR detectors.

For samples placed in a magnetic field of sufficiently high homogeneity, it is possible to record different chemical species containing a common nucleus. Not only can a proton be distinguished from a uranium nucleus, but also protons in water molecules can be distinguished from protons in hydrogen gas molecules. In fact, protons in water molecules that are in different physical environments can be distinguished. The resolving capability of chemical shift makes the toroid cavity detector a useful device for analyzing and monitoring various types of radioactive materials from spent nuclear fuel to plutonium ash.

The toroid cavity detector also differs from other, more conventional electromagnetic detectors in that it produces a gradient in the generated RF magnetic field. This $B_1$ field gradient has a mathematically well-defined spatial distribution. This magnetic field gradient feature has two significant consequences. First, the sensitivity of the toroid cavity is radially distributed, with the greatest sensitivity near the central axis of the device or a principal detector element located in the toroid cavity along the central axis. This enables measurements on samples of limited quantity. Second, concentric annular regions of a sample contained in the toroid cavity exchange energy with the resonator circuit at different rates. Thus, analysis of energy transfer rates in a toroid cavity can yield a radial spatial mapping of the different nuclear constituents in a cylindrical sample container. The toroid cavity also has been proven to function with asymmetric conductors.

As is disclosed in U.S. Pat. Nos. 5,574,370 and 6,046,592, the toroid cavity of a toroid cavity detector can be a cylindrically shaped, hollow housing which is closed at both opposite ends and made for example of copper. A central conductor or working electrode (for example, an inner wire or rod in a Teflon outer jacket) extends through the base of the cylinder and is positioned coincident with the major, central axis of the cylinder. In the case of the toroid cavity disclosed in the '370 patent, a fluid or gas sample to be analyzed by the toroidal cavity detector is simply introduced into the toroid cavity whereas in the case of the toroid cavity detector disclosed in the '592 patent, the fluid or gas sample to be analyzed is introduced into an electrochemical cell compartment which is disposed within the toroid cavity. This electrochemical cell compartment consists of a cylindrically shaped glass container along the central axis of which extends the working electrode of the toroid cavity detector and into which a counter electrode is disposed. The counter electrode consists of a cylindrical solenoid coil that is positioned in the electrochemical cell compartment (either at the base of the compartment or expanded along the walls of the compartment) so that it is symmetrical about the centrally located working electrode. In operation, voltages are applied across the working electrode and the counter electrode by means of an external potentiostat resulting in the chemical composition of the sample being changed adjacent to the working electrode within the electrochemical cell compartment. A NMR spectrometer records the response of the sample to the applied magnetic field generated by the toroid cavity detector when a RF frequency signal is applied to the working electrode. The use of such an electrochemical cell compartment within the toroid cavity detector allows for the measurement of macroscopic transport properties, local dynamics, and chemistry of ions as a function of distance from the electrode.

In the toroid cavity detector of the type disclosed in the '370 and '592 patents, the $B_1$ field is completely confined within the cavity formed in the housing of the toroid cavity detector and is generated when an RF signal is transmitted along the central conductor. The $B_1$ field is strongest near the central conductor and drops off as the inverse of the distance toward the outer wall of the toroid cavity. Both sensitivity and distance resolution increase with the gradient in the $B_1$ field and consequently, the toroid cavity detector provides a means to image simultaneously both the chemical shift of the targeted nuclei as well as their radial distance from the center and is well suited for NMR microscopy of films that uniformly surround the central conductor. In this regard, the amount of energy that is absorbed or transmitted by a sample within the toroid cavity detector varies with the location of the sample within the toroidal cavity such that multiple distances within the NMR active sample can be resolved by varying the transmitter pulse length. Because a homogeneous $B_0$ field is used, the chemical shift information is not destroyed by the imaging process as happens in conventional magnetic resonance imaging (MRI) where transient inhomogeneous $B_0$ fields are required. In addition, such toroid cavity detectors appear to be useful for investigations of solids and polymers where broad lines usually limit the spatial resolution to 50–100 $\mu$m. High-pressure and high-temperature capabilities of toroid cavities enable measurements of penetration rates of gaseous molecules in polymer or ceramic films in situ. In most instances, electrochemical processes can be monitored when the central conductor is used as a working electrode.

The toroid cavity detectors of the type disclosed in the '370 and the '592 patents have the advantage of providing a rugged reaction chamber that is readily machined from a variety of alloys, and the alternating magnetic field is highly confined within the cavity detector. Confining the alternating magnetic field minimizes sensitivity losses that occur through magnetic coupling with a high-pressure housing. Most importantly, the toroid cavity detector produces a well-defined magnetic field gradient, which, as noted above, varies with the inverse of the radial displacement from the center of the cavity. The resultant NMR intensity ($I/I_1$) is predicted to depend on the transmitter pulse length, t, according to the following equation:

$$I/I_0 = 2\pi h \int_{r_1}^{r_2} \sin(-\gamma At/r)dr$$

where $\gamma$ is the gyromagnetic ratio, h is the height of the toroid, r is the radial distance from the center of the cavity, $r_1$ is the radius of the central conductor, $r_2$ is the inside radius of the cavity, and A is the proportionality constant defining the magnetic field as follows:

$$B_1 = A/r$$

The 1/r relation for the $B_1$ field suggests that both the NMR sensitivity and the distance resolution should increase for materials that are close to the central conductor. Thus, the toroid cavity NMR resonator or detector is particularly powerful in the characterization of surface layers applied to the central conductor.

The use of a toroid cavity detector enables complete NMR spectral information to be retained during signal processing. Additionally, the strong gradient that is intrinsic to the torus enables the toroid cavity detector to provide a theoretical spatial resolution that is better than is possible with conventional MRI. Also, spatial resolution with the toroid cavity imager is less dependent on the line widths of the NMR signals used in the measurements because chemical shift information is not used to determine the distance as it is in conventional MRI.

The toroid cavity detectors of the type disclosed in the '370 and '592 patents provide the above discussed and other significant advantages. However, the toroid cavity detectors disclosed in those patents are limited to analyzing objects that are of a cylindrical configuration or can be deposited on, can be affixed to or otherwise can surround the cylindrically shaped working electrode that extends along the elongated central axis of the toroid cavity. However, it would be advantageous to utilize a toroid cavity detector for in situ magnetic resonance analysis of samples that cannot be necessarily deposited on or affixed to a cylindrical detector element of the toroid cavity detector. One such sample is a disk electrode coin cell battery.

Coin cell batteries have become more in demand due to the increase in portable compact electronic equipment. In particular, lithium-ion rechargeable batteries have been the focus of intense research. These batteries are concentrated cells powered by the transfer of lithium ions between two electrodes that are composed of lithium-containing compounds at different concentration levels and therefore having different lithium activities. The use of carbonaceous materials as anode electrodes offers a number of advantages such as the prevention of deterioration of the electrode caused by branchlike growth of metallic lithium upon charging; the increase of the whole-cell cycle life—making longer-lasting batteries feasible; and the improvement of the reliability, minimizing the risk of explosion from volume expansion associated with using and recharging the batteries. The lower specific capacity of carbon as opposed to lithium metal is compensated for by the use of high voltage cathode materials.

A lithium-ion coin cell battery is encased in a stainless steel housing and includes a series of stacked discs. For example, the coin cell battery could include a lithium negative electrode, a microporous membrane as a separator (an insulator between opposed electrodes of the battery) and a carbon positive electrode. In many instances, the carbon is a thin film that is deposited on the inner surface of the positive electrode. In order to analyze the carbon electrode in a toroid cavity detector, attempts were made to reproduce the carbon used on the electrode and apply it as a film onto the working electrode of the toroid cavity detector. While such analyses provide some information as to the carbon electrode material, the film that was deposited on the working electrode did not necessarily duplicate the film that was actually used in the coin cell batteries and certainly the film was not being analyzed as the battery was being used (for example, at the different levels to which the battery was charged or discharged).

In view of the fact that the elements of a coin cell battery need to be oriented within a toroid cavity detector so that the planes of the elements (disks) are parallel to the axis of the working electrode of the toroid cavity detector, it is not feasible to use the toroid cavity detectors such as those disclosed in the '370 and '592 patents to obtain in situ NMR analysis of such coin cell batteries. This is in part due to the fact that the principal detector element of such toroid cavity detectors (i.e., the working electrode) is generally cylindrical in shape and the coin cell battery disk-shaped components cannot be conformed to that shape or affixed relative thereto in an appropriate orientation. Consequently, it would be advantageous to devise a modified principal detector element to be able to analyze such non-cylindrical elements within a toroid cavity detector.

Accordingly, it is an object of the present invention to provide a new and improved toroid cavity detector having a principal detector element that is shaped such that non-cylindrical samples can be analyzed.

It is another object of the present invention to provide a new and improved toroid cavity detector having a flat metal principal detector element to which components of a coin cell battery can be held in electrical contact for in situ magnetic resonance analysis.

It is still another object of the present invention to provide a new and improved toroid cavity detector having a flat metal principal detector element to which samples can be held for in situ magnetic resonance analysis and simultaneously view or probe visible light.

It is yet another object of the present invention to provide a new and improved toroid cavity detector having a sample relative to a principal detector element.

It is still a further object of the present invention to provide a new and improved toroid cavity detector having a flat metal principal detector element to which membranes and thin film materials can be held for in situ magnetic resonance analysis including where the materials can be subjected to different kinds of light to analyze absorption or fluorescence.

SUMMARY OF THE INVENTION

In accordance with these and many other objects of the present invention, a toroid cavity detector or resonator includes an outer cylindrical housing having a top and base portion that forms a cylindrical cavity. A first electrical conductor extends from a potentiostat through the top of the housing, along the central longitudinal axis of the housing to a principal detector element (for example, an alloy disk or a carbon coated metallic disk). A second electrical conductor extends from the principal detector element along the central longitudinal axis of the housing and through the base of the housing to an NMR spectrometer. The principal detector element is a flat metal conductor in a regular or irregular shape. In order to analyze a sample held adjacent to or in contact with the principal detector element within the housing, the housing is placed in an externally applied static main homogeneous magnetic field ($B_0$) produced by a NMR magnetic device, the magnetic field ($B_0$) being oriented perpendicular to the surface normal of the principal detector element. The presence of the $B_0$ field causes the magnetic moments of a targeted class of nuclei in the sample to precess about the field's axis at a rate which is dependent on the magnetic field strength. An RF excitation signal pulse is supplied through the first and second electrical conductors and the principal detector element from the NMR spectrometer such that an alternately energized and de-energized magnetic field ($B_1$) is produced in the sample and through the toroid cavity. This $B_1$ field is oriented perpendicular to the $B_0$ field and causes transitions between adjacent (allowed) or non-adjacent (unallowed) magnetic energy levels of electronic or nuclear origin. The resulting fluctuating magnetic and/or electric fields emanating from the sample induce alternating signal currents in the principal detector element which are detected during, after or interspersed with the application of the alternating excitation signal pulse. The detected signals are recorded by an analog-to-digital converter with a high sampling rate, stored in a computer and analyzed for quantitative speciation (elemental/chemical composition) of different nuclides. Quantitative speciation can be obtained for the bulk sample or as function of the position of the sample away from the surface of the principal detector element in the direction normal to the surface of the principal detector element.

One embodiment of the present invention includes a coin cell battery imager which is adapted to be mounted within the toroid cavity relative to the principal detector element. In this embodiment, the principal detector element is a circular, generally flat metal conductor that is disposed in a circular recess in a non-conductive cylindrical holder. The holder additionally includes a groove which surrounds the recess and which is adapted to either form or receive an O-ring and threaded holes extending through the holder radially outward of the groove. A non-conductive cell cover or end cap is adapted to be secured to the holder by non-conductive screws such that it functions as a piston assembly compressing circularly shaped components (disks) of a coin cell battery (including a carbon electrode, a permeable electrical separator, electroactive metal or counter electrode (lithium) and a metallic solid or mesh current collector) and a liquid electrolyte between the holder and the cap. With the cap secured to the holder, the carbon electrode is forced against the principal detector element (which serves as the direct current collector) and the coin cell battery components are hermetically sealed with the electrolyte due to a flange on the inside surface of the cap compressing the O-ring in the groove in the holder. The mesh current collector is coupled to the potentiostat by a wire that protrudes through the end cap into engagement with the mesh current collector. The battery formed by the coin cell imager is operated by a direct current (DC) potential being supplied from the potentiostat. The circuit for supplying the DC potential includes the first and second electrical conductors, the principal detector element, the coin cell battery components disposed within the coin cell imager and the wire connected between the mesh current collector and the potentiostat. As a result, the battery components can be subjected to charging and discharging by the potentiostat just as they would be when a normal coin cell battery is being operated so that in situ NMR analysis of the battery components can be accomplished with the analysis being made of the components at different dynamic conditions of the battery components as the battery is being charged or discharged.

In another embodiment of the present invention, the circular disk components of a coin cell battery are encircled by an O-ring made of chemically compatible material and the O-ring and coin cell battery components (including a carbon electrode, a permeable electrical separator, electroactive metal or counter electrode (lithium) and a metallic solid current collector) and an electrolyte are disposed between the principal detector element (in this case, a generally flat circular metal conductor) and another circular non-permeable solid electrically conductive contact member. A non-conductive piston or compression assembly is used to compress the O-ring and the battery components between the principal detector element (a circular, generally flat metal conductor) and the other contact member, also known as the counter electrode. As a result, the battery components and the electrolyte are hermetically sealed within the compressed O-ring. A contact wire is extended through the piston assembly so that the battery can be operated by a potentiostat coupled to the counter electrode and the contact wire. As a result, the battery components can be subjected to charging and discharging by the potentiostat just as they would be when a normal coin cell battery is being operated so that in situ NMR analysis of the battery components can be accomplished with the analysis being made of the components at different dynamic conditions of the battery components as it is being charged or discharged.

In still another embodiment of the present invention, the principal detector element is a generally oval-shaped, flat metal conductor that is secured to electrical conductor rods and disposed within the toroid cavity. In this embodiment, a sample (gas, liquid, or solid) is encircled by an O-ring. The sample and O-ring are positioned between one flat side of the principal detector element and a glass plate. Another glass plate is positioned against the opposite flat side of the principal detector element. The glass plates are compressed towards each other by the tightening of nonconductive screws that extend through aligned holes in the glass plates into nonconductive nuts. As a result, the sample and O-ring are compressed against one flat side of the principal detector element and the sample is hermetically sealed between the glass plate and the principal detector element. Light (ultraviolet, visible or infrared) can be transmitted through the glass plate into the sample, back-reflected from the principal detector element, transmitted back through the sample and analyzed for absorption or fluorescence.

In yet another embodiment of the present invention, a semi-permeable membrane can be analyzed by using a principal detector element that is permeable. The principal detector element is a generally circular, square, or oval-shaped, flat metal conductor with a plurality of holes extending through it that is secured to electrically conductive rods and disposed within the toroid cavity. In this embodiment, a semi-permeable membrane is positioned against one flat side of the principal detector element. A sample (gas, liquid, or solid) encircled by an O-ring is positioned between that semi-permeable membrane and a glass plate. Another semi-permeable membrane is positioned against the opposite flat side of the principal detector element. Another sample (gas, liquid, or solid) encircled by an O-ring is positioned between that other semi-permeable membrane and another glass plate. The glass plates are compressed towards each other by the tightening of nonconductive screws that extend through aligned holes in the glass plates into nonconductive nuts. As a result, the samples and O-rings on both sides of the principal detector element are compressed against the semi-permeable membrane on the respective sides of the principal detector element. An osmotic pressure can be developed across the semi-permeable membrane so that atoms, molecules, and/or ions pass through the semi-permeable membrane and reach the principal detector element. As a result, the material that has passed through the membrane is placed directly at the most sensitive region of the toroid cavity detector, i.e., in close proximity to the principal detector element. This material can be analyzed and identified according to its spatial location by an imaging procedure or by a measured signal enhancement.

BRIEF DESCRIPTION OF THE DRAWINGS

These and many other objects and advantages of the present invention will become readily apparent from consideration of the following detailed description of the embodiments of the invention shown in the accompanying drawings wherein.

DETAILED DESCRIPTION OF THE PREFERRED EMBODIMENTS

Figure 1:
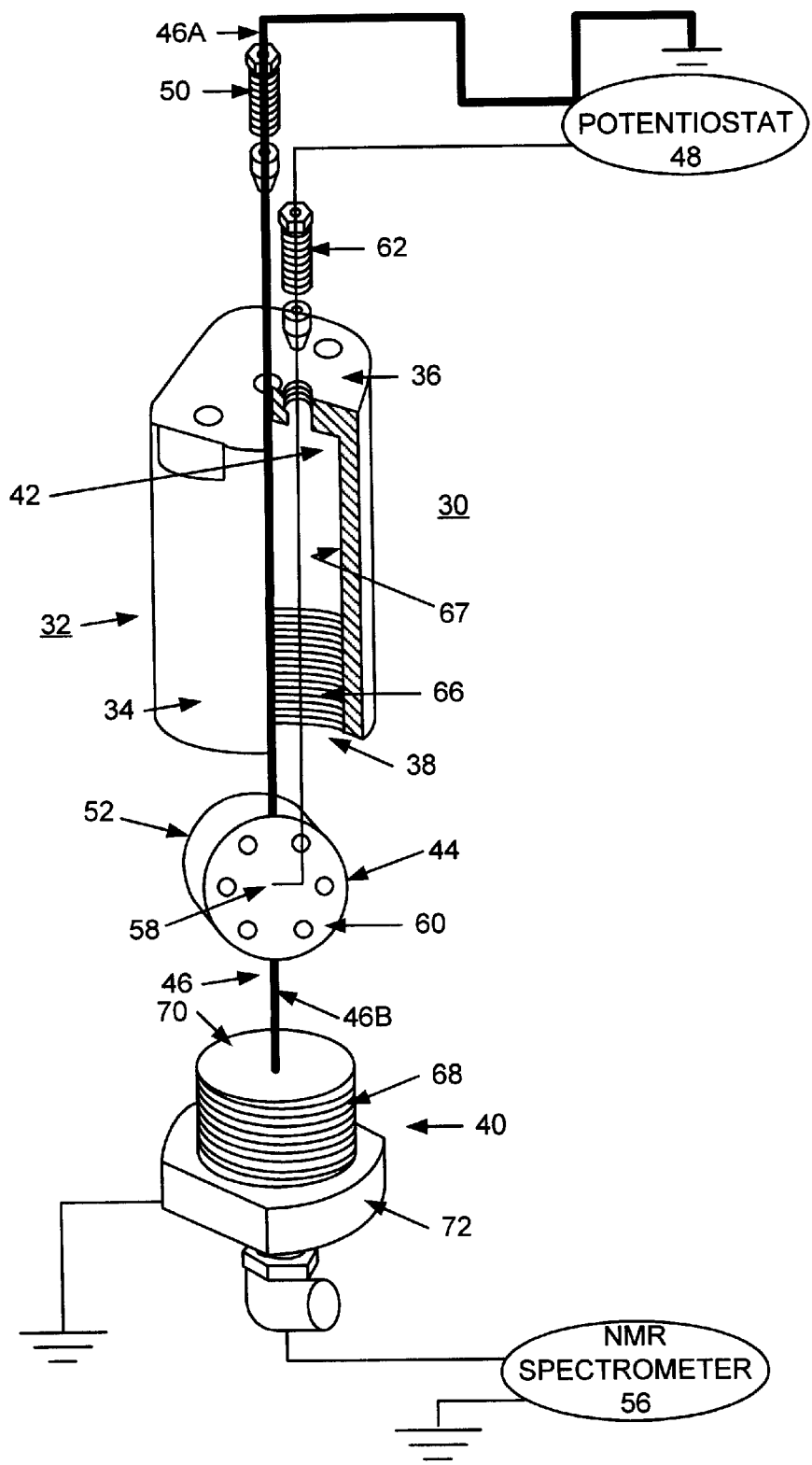
FIG. 1 is a schematic, partially cut away, partially cross-sectional, exploded perspective view of a toroid cavity detector which is shown with a coin cell battery imager disposed therein and which embodies the present invention.

Referring now more specifically to FIG. 1 of the drawings, therein is disclosed a schematic representation of a toroid cavity detector that is generally designated by the reference numeral 30 and that embodies the present invention. The toroid cavity detector 30 includes a generally elongated, cylindrical shaped housing 32 with side walls 34 extending from a closed top end 36 to an open bottom end 38. The bottom end 38 is closed by a base 40 that is grounded and that is threaded into the open bottom end 38 such that an enclosed toroid cavity 42 is formed. In the case of the toroid cavity detector 30, a coin cell battery holder or imager 44 is disposed in the toroid cavity 42 with a electrical conductor 46 extending therethrough. An upper portion 46A of the electrical conductor 46 extends from a potentiostat 48, through a compression fitting 50 threaded into the top 36 of the housing 32 and into a holder portion 52 of the coin cell battery holder 44. As will be described in more detail hereinafter (in particular in connection with FIGS. 2–7 of the drawings), a principal detector element 54 is positioned in the holder portion 52 and is connected to the upper portion 46A of the electrical conductor 46 and to a lower portion 46B of the electrical conductor 46 that extends out from the holder portion 52 through the base 40 to a NMR spectrometer 56 that is grounded. As further illustrated in FIG. 1 of the drawings, a counter electrode wire 58 extends from an end cap 60 of the coin cell battery holder 44 through a compression fitting 62 to the potentiostat 48.

Figure 2:
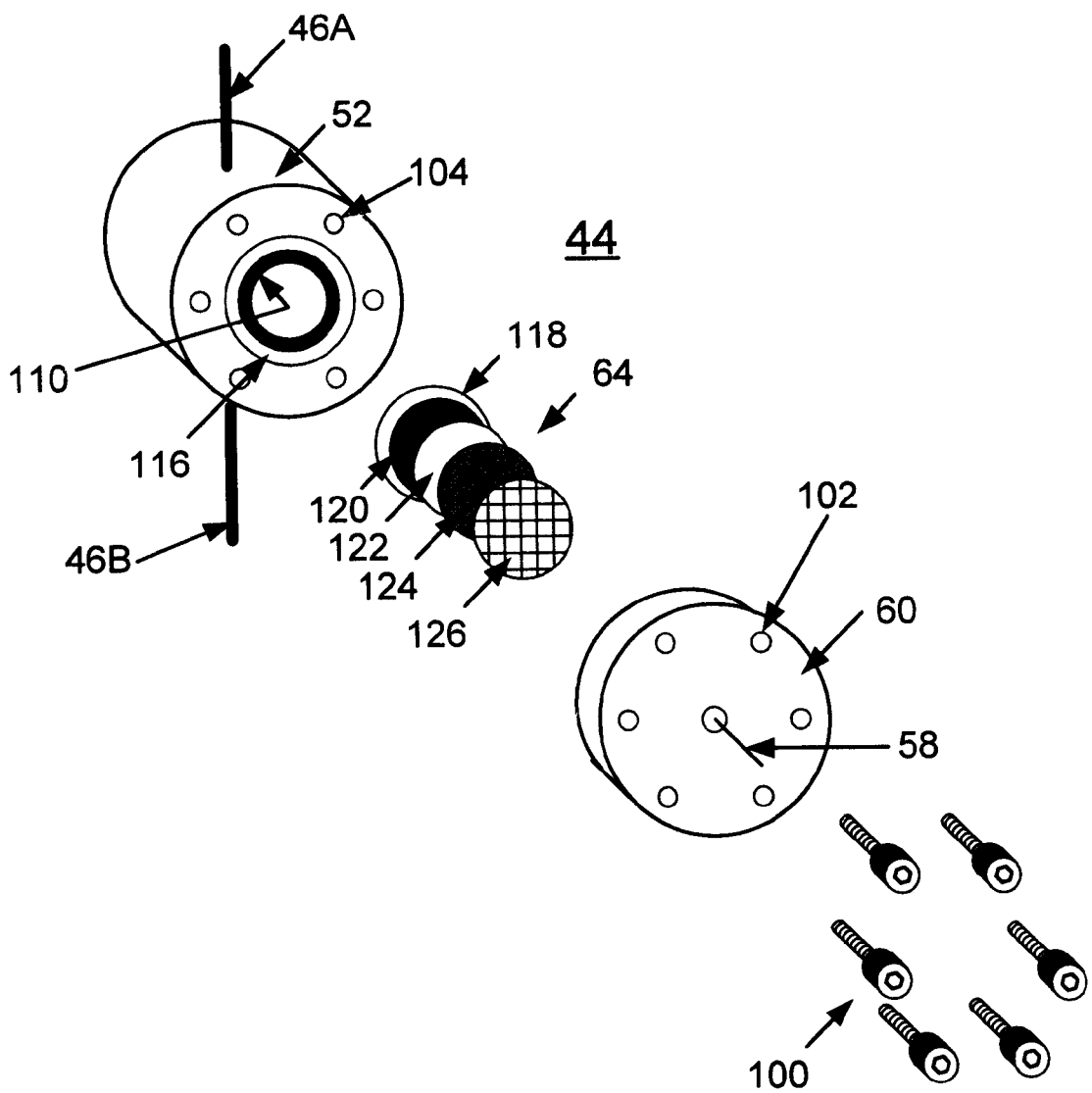
FIG. 2 is an exploded perspective view of the coin cell battery imager disclosed in FIG. 1 of the drawings.
Figure 3:
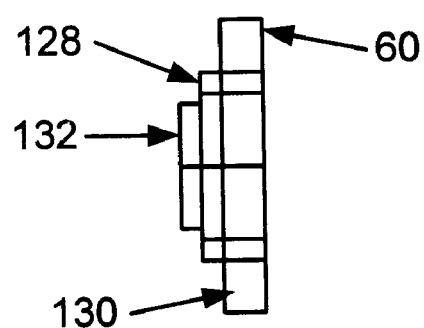
FIG. 3 is a side planar view of the cap portion of the coin cell battery imager disclosed in FIG. 2 of the drawings.
Figure 4:
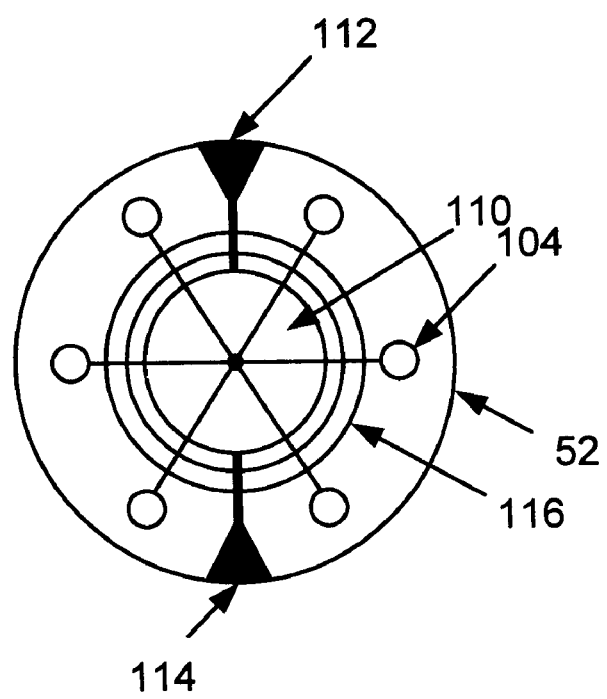
FIG. 4 is a top planar view of the holder portion of the coin cell battery imager disclosed in FIG. 2 of the drawings.

The toroid cavity detector 30 can be used to analyze coin cell battery components which are generally designated by the reference numeral 64 in FIG. 2 and which are disposed in the coin cell battery holder 44 that is positioned in the toroid cavity 42. In order to analyze the coin cell battery components 64, the housing 32 is placed in an externally applied static main homogeneous magnetic field ($B_0$) produced by a NMR magnetic device or the like (not shown). The axis of the $B_0$ field is along the elongated axis of the toroid cavity 42. The presence of the $B_0$ field causes the magnetic moments of a targeted class of nuclei in the battery components 64 to precess about the field's axis at a rate which is dependent on the magnetic field strength. An RF signal pulse is generated by and transmitted from the NMR spectrometer 56 along the lower electrical conductor portion 46B, through the principal detector element 54 and along the upper electrical conductor portion 46A to ground. This RF signal pulse causes an alternately energized and de-energized magnetic field ($B_1$) to be produced in the toroid cavity 42. This $B_1$ field is oriented perpendicular to the $B_0$ field. Following the RF pulse, the response of the coin cell battery components 64 to the applied field is detected and in most applications, received signals from the energized nuclei are supplied via the electrical conductor 46 to the NMR spectrometer 56 so that a spectroscopic analysis of the coin cell battery components 64 can take place.

Advantageously, this spectroscopic analysis of the coin cell battery components 64 can be accomplished while the battery components 64 are being operated as they would be in a coin cell battery. In this regard, DC potential is supplied to the coin cell battery components 64 from the potentiostat 48, through the upper electrical conductor 46A and through the principal detector element 54, through the coin cell battery components 64 and through the counter electrode wire 58 to the potentiostat 48 such that a DC circuit is completed from and to the potentiostat 48 through the battery components 64. As a result, the battery components 64 can be subjected to charging and discharging by the potentiostat 48, just as they would be when a normal coin cell battery is being operated, when the magnetic field $B_1$ is being alternately energized and de-energized within the toroid cavity 42. Consequently, the NMR analysis of the battery components 64 takes place while the battery components 64 are in situ and at different dynamic conditions of the battery components 64 as they are being charged or discharged.

As is shown in FIG. 1 of the drawings, the detector housing 32 has a generally elongated, cylindrical shape and may be machined from an elemental metal stock, an alloy or other suitable material that can provide a container that is non-magnetic, electronically conductive and withstands high pressures. For example, the housing 32 can be made of copper, stainless steel, beryllium copper or other nonmagnetic materials. The cylindrically shaped side walls 34 of the housing 32 extends from its top portion 36 to its bottom portion 38. In the case of the housing 32, the top portion 36 is closed, i.e., it is integrally formed with the side walls 34, but alternatively, the top portion 36 can be a separate insert or plug inserted into an opening in the top portion 36. On the other hand, the bottom portion 38 of the housing 32 has a generally circular opening 38 with internal threads 66 along an side wall 67 at the opening 38. The base 40 has external threads 68 at a closure portion 70 of the base 40 enabling the closure portion 70 to be threaded into the opening 38 so as to seal the opening 38. With the closure portion 40 threaded in the opening 38, the toroid cavity 42 is sealed. A lower base portion 72 of the base 40 can be used to mount the housing 32 to a holder or support (not shown). By having at least the base 40 removable from the housing 32, access is provided to the toroid cavity 42 so that the battery components 64 can be removed from or inserted into the coin cell battery holder 44.

Figure 8:
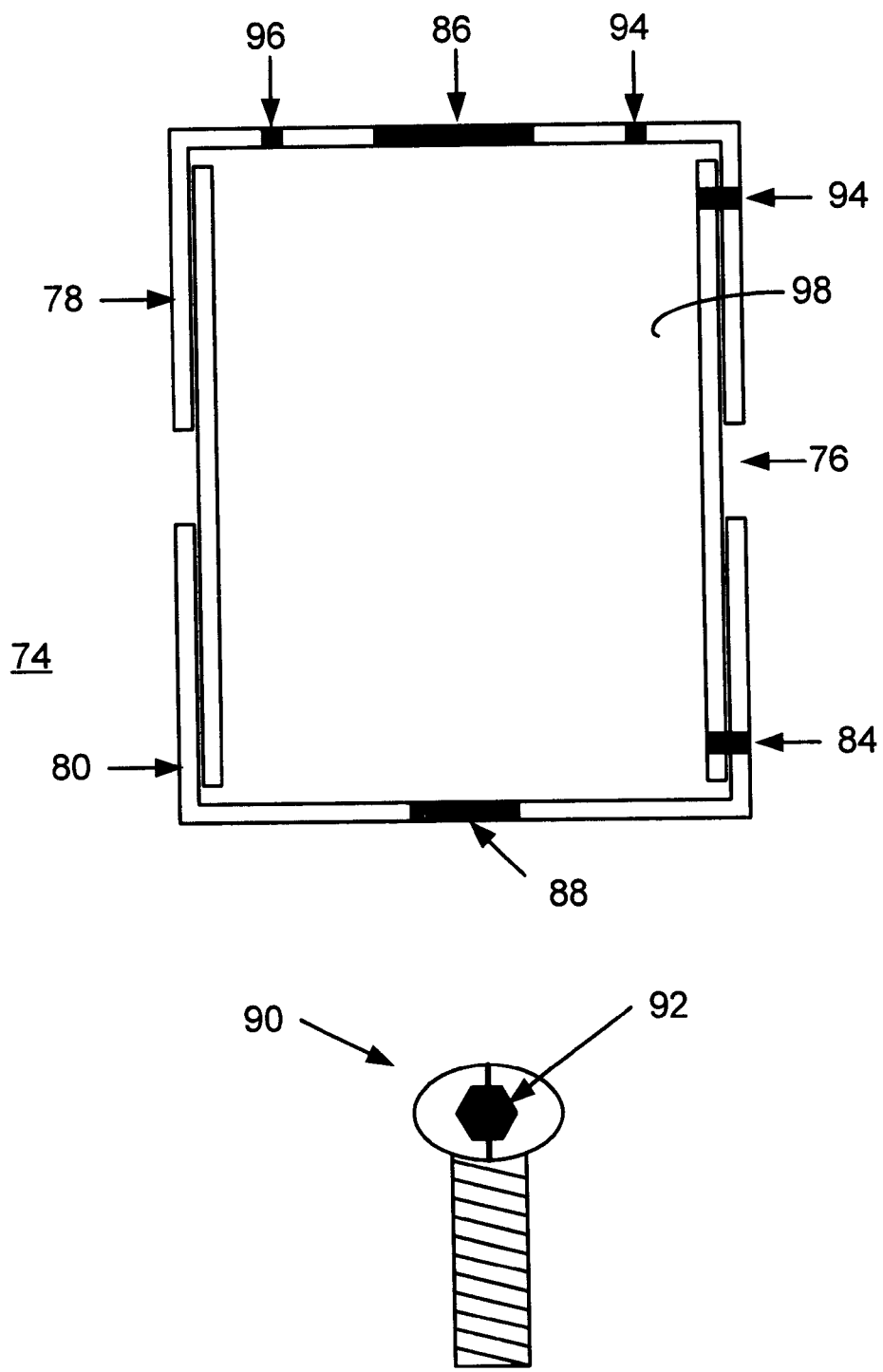
FIG. 8 is a side planar view of an alternate embodiment of a toroid cavity housing for the toroid cavity detector of FIG. 1.

While the housing 32 is shown in FIG. 1 as a regular cylindrical shaped container, other regular cross section shapes (for example, a circle, oval, square or rectangle) or irregular cross section shape can be utilized. Alternately, the housing 32 can be replace by a three part housing 74 shown in FIG. 8 of the drawings. The housing 74 may be made from an elemental metal stock, an alloy or other suitable material that can provide a container that is non-magnetic, electronically conductive and withstands high pressures. For example, the housing 74 can be made of copper, stainless steel, beryllium copper or other nonmagnetic materials. The housing 74 is formed of three separable sections, i.e., a middle tube portion 76, an upper cap 78 and a lower cap 80. The upper cap 78 is secured to one end of the middle tube portion 76 by a fastener (not shown) that is threaded into aligned threaded screw holes 82 and the lower cap 80 is secured to the other end of the middle tube portion 76 by a fastener (not shown) that is threaded into aligned threaded screw holes 84. The electrical conductor 46 is extended through a hole 86 in the top cap 78 and a hole 88 in the lower cap 80. The hole 88 can be sealed by a brass screw, like the screw 90 illustrated in FIG. 8, through which extends a bore 92. The hole 86 can be sealed by an electrical insulator feedthrough. Additional through holes 94 and 96 are provided in the top cap 78 for additional access to a toroid cavity 98 formed by the housing 74 (for example, so that the counter electrode wire 58 can be extended into the cavity 98). The fact that both the top cap 78 and the bottom cap 80 can be separated or removed from the middle tube portion 76 allows more ready access to the toroid cavity 98.

As previously indicated, the upper portion 46A of the electrical conductor 46 extends from the potentiostat 48 through the compression fitting 50 in the top 36 of the housing 32 to the principal detector element 54 and then out through the base 40 to the NMR spectrometer 56. In the case of the toroid cavity detector 30 disclosed in FIG. 1, the electrical conductor 46 and the principal detector element 54 are disposed along the central, elongated axis of the housing 34. Alternately, the electrical conductor 46 and the principal detector element 54 can be displaced laterally from that axis. The electrical conductor 46 may include an the outer insulating jacket with an inner wire disposed therein. The jacket can be made of any suitable insulating material (for example, TEFLON). Alternately, the electrical conductor 46 can be a hollow rod that is made of copper or the like. The counter electrode wire 58 may be a wire having an outer jacket or the like. When the NMR spectrometer 56 supplies an RF current along the electrical conductor 46, the housing 34 provides a return path for the current flowing along the electrical conductor 46 and the $B_1$ field is energized within the toroid cavity 42. This field $B_1$ is generally perpendicular to the $B_0$ field that is within the toroid cavity detector 30. By pulsing of a RF current, the $B_1$ field within the toroid cavity 42 is alternately energized and de-energized. The response of any sample within the toroid cavity 42 to the applied $B_1$ field is detected and in most applications, received signals from the energized nuclei serve as input signals for spectroscopic analysis of the sample.

The principal detector element 54 is a part of the path for the RF signals and in the case of the toroid cavity detector 30 of FIG. 1 is disposed within the coin cell battery holder 44 so that the battery components 64 can be analyzed. With particular reference to FIGS. 2–7, the coin cell battery holder 44 can be dimensioned to mimic the configuration of a standard 2032-size coin cell although it can be also dimensioned to mimic any other sized coin cell. The coin cell battery holder 44 includes the holder 52 in which the principal detector element 54 is disposed and the end cap 60. The end cap 60 is secured to the holder 52 by non-conductive screws 100 that extend through holes 102 in the end cap 60 and threaded into threaded holes 104 in the holder 44. When the end cap 60 is so secured to the holder 52, the battery components 64 are hermetically sealed within the coin cell battery holder 44.

Figure 5:
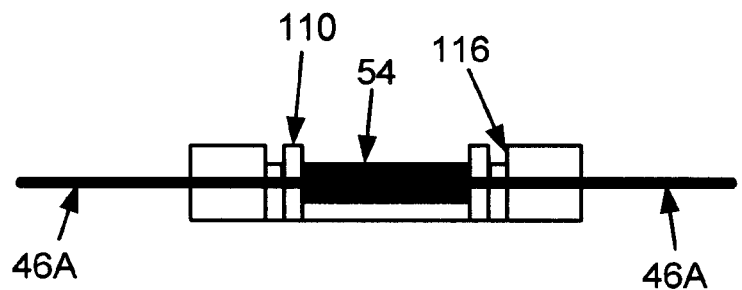
FIG. 5 is a side planar view of the holder portion of the coin cell battery imager disclosed in FIG. 2 of the drawings with two electrical conductors coupled to a principal detector element disposed therein.
Figure 6:
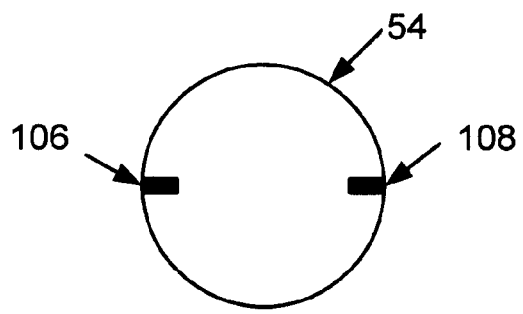
FIG. 6 is a top planar view of the principal detector element disclosed in FIG. 5 of the drawings.
Figure 7:
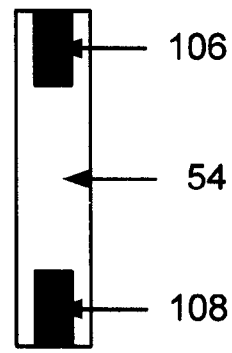
FIG. 7 is a side planar view of the principal detector element disclosed in FIG. 6 of the drawings.

As is shown in FIGS. 5–7, the principal detector element 54 is a generally circular, flat metal conductor made of copper or the like and the plane of the principal detector element 54 is parallel to the longitudinal axis of the toroid cavity housing 32. The upper portion 46A of the electrical conductor 46 is secured to the principal detector element 54 at a threaded hole 106 and similarly the lower portion 46B of the electrical conductor 46 is secured to the principal detector element 54 at a threaded hole 108. The principal detector element 54 is disposed in a circular recess 110 in the cylindrically shaped holder 52. The holder 52 and the end cap 60 are formed of a nonconductive material such as TEFLON. The holder 52 has through holes 112 and 114 so that the electrical conductor portions 46A and 46B can be extended for attachment to the principal detector element 54. The holder 52 additionally includes a circular groove 116 which surrounds the recess 110 and which is adapted to receive an O-ring 118. The O-ring 118 is compressed in the groove 116 when the cap 60 is secured to the holder 52 so that the battery components 64 that are disposed in the coin cell battery holder 44 are hermetically sealed within the coin cell battery holder 44.

The coin cell battery components 64 that are disposed in the coin cell battery holder 44 are circularly shaped components or disks and include a carbon electrode 120, a permeable electrical separator 122, an electroactive metal or counter electrode 124 and a metallic solid or mesh current collector 126. In addition, an electrolyte (not illustrated in FIG. 2) can be included with the battery components 64 when they are hermetically sealed in the coin cell battery holder 44.

The carbon electrode 120 is positioned against the principal detector element 54 such that the principal detector element 54 also functions as the current collector for the carbon electrode material 120. This positioning of the carbon electrode 120 against the principal detector element 54 is advantageous because that is where the optimum NMR signal sensitivity is located. This is important due to the fact that there is considerable interest in the carbon electrode 120 and its performance capabilities. In this regard, carbonaceous materials have received considerable interest for use as anodes in lithium-ion batteries. When such carbon containing anodes are used, the batteries are noted for potential safety and reliability because the carbon anodes are less prone to form dendrites than metallic lithium anodes. Most investigations have utilized carbon materials that are available from existing sources such as natural graphite, cokes, carbon fibers, non-graphitizable carbon, and pyrolitic carbon. While these investigations have provided some information, the toroid cavity detector 30 that utilizes the coin cell battery holder 44 allows the analysis of carbon electrodes, such as the disk 120, fabricated by the battery manufacturer in the identical manner as they are made for use in the coin cell batteries.

The permeable electrical separator 122 is disposed between the carbon electrode 120 and the electroactive metal or counter electrode 124. The separator can be made of Celgard and functions to electrically isolate the counter electrode 124 from the carbon electrode 120 so that they do not short together when a DC current is flowing from the potentiostat 48 through the upper portion 46A of the electrical conductor 46 and the counter electrode wire 58. The electroactive metal disk 124 can be a lithium disk formed from a sheet of lithium foil. In order to couple the lithium disk 124 to the counter electrode wire 58, a copper mesh current collector 126 is disposed between the end cap 60 and the lithium disk 124. The counter electrode wire 58 extends through the end cap 60 so as to be in contact with the current collector 126.

In order to seal the battery components 64 within the coin cell battery holder 44, the O-ring 118 is inserted into the groove 116 and the screws 100 are extended through the screw holes 102 and threaded into the threaded holes 104 in the holder 44. As the screws 100 are being so threaded, the O-ring 118 is compressed between the groove 116 and a flange 128 extending from an inside surface 130 of the end cap 60. In addition, a projection 132 extending inwardly from the end cap 60 presses against the mesh current collector 126 such that the counter electrode 124, the separator 122 and the carbon electrode 120 are compressed together within the O-ring 118. As a result, the battery components 64 are hermetically sealed by the O-ring 118 so that an electrolyte can be included with the battery components 64. The compression of the battery components 64 in this manner results in the carbon electrode 120 being forced against the principal detector element 54 lodged in the recess 110 of the holder 52. As indicated above, the carbon electrode 120 is accordingly at a location where the most optimum NMR signal sensitivity is located.

With the battery components 64 so sealed in the holder 44, a DC potential can be applied to the components 64 from the potentiostat 48 through the upper electrical conductor 46A, the principal detector element 54 and the counter electrode wire 58 to the potentiostat 48 such that a DC circuit is completed from the potentiostat 48 through the battery components 64. As a result, the battery components 64 can be subjected to charging and discharging by the potentiostat 48 just as they would be during normal operation of the coin cell battery when the magnetic field $B_1$ is being alternately energized and de energized within the toroid cavity 42. Consequently, the NMR analysis of the battery components 64 takes place while the battery components 64 are in situ and at different dynamic conditions of the battery components 64 as they are being charged or discharged.

Figure 13:
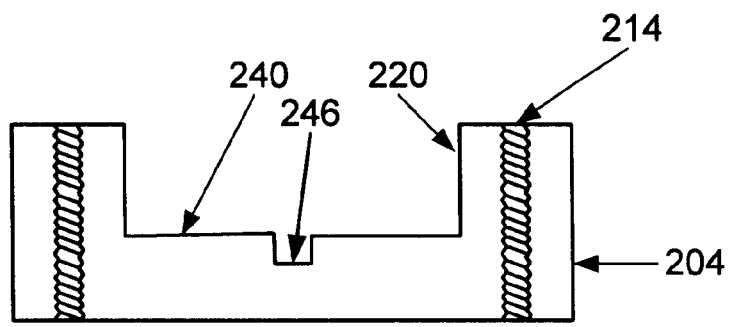
FIG. 13 is a side planar view of the bottom press component of the press assembly of FIGS. 9 and 10.
Figure 14:
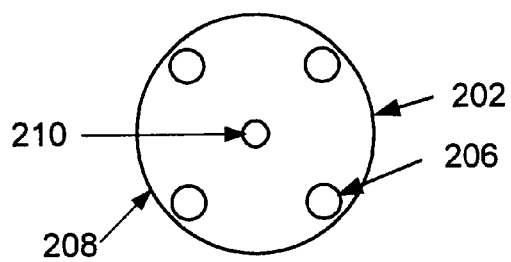
FIG. 14 is a top planar view of the top press component of the press assembly of FIGS. 9 and 10.
Figure 15:
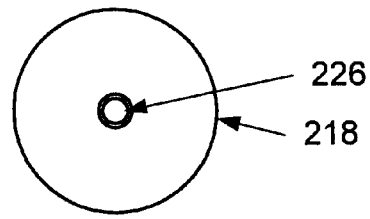
FIG. 15 is a top planar view of the current collector used in the press assembly of FIGS. 9 and 10.
Figure 16:
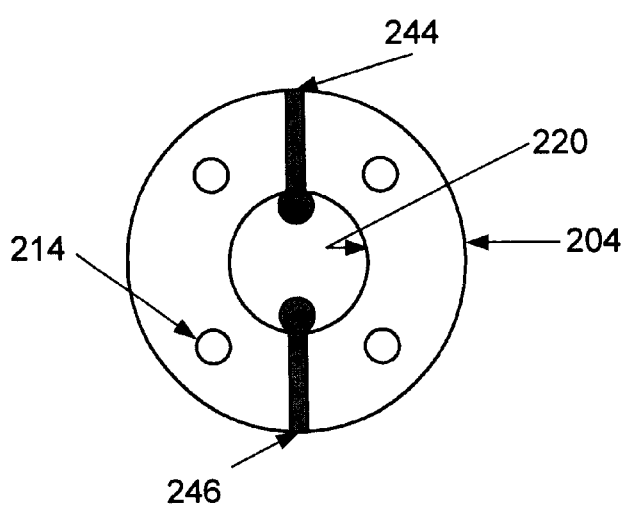
FIG. 16 is a top planar view of the bottom press component of the press assembly of FIGS. 9 and 10.

As discussed above with respect to the coin cell battery holder 44, that holder 44 permits in situ NMR analysis of the components 64 of a coin cell battery in a toroid cavity detector 30. Another mechanism for holding the components 64 of a coin cell battery for such in situ NMR analysis of battery components is disclosed in FIGS. 9–16 of the drawings. More specifically, a non-conductive and non-magnetic press or compression assembly 200 is disclosed in FIGS. 9–10 and embodies the present invention. The press assembly 200 is adapted to be mounted in a toroid cavity housing like the housing 32 disclosed in FIG. 1 of the drawings in place of the coin cell battery holder 44 and includes a top press portion 202 and a bottom press portion 204. The top press portion 202 has a generally cylindrical shape (see FIGS. 11 and 14) as does the bottom press portion (see FIGS. 13 and 16). The top press portion has a series of through holes 206 near its outer circumferential surface 208 and a threaded hole 210 at its central axis. Knurled top nylon screws 212 extend through the through holes 206 and are threaded into corresponding threaded holes 214 in the bottom press portion 204 in order to secure the top press portion 202 to the bottom press portion 204. Another knurled top nylon screw 216 is threaded into the threaded hole 210 in the top press portion 202 and applies a force against a piston 218 when turned clockwise (tightened).

Figure 9:
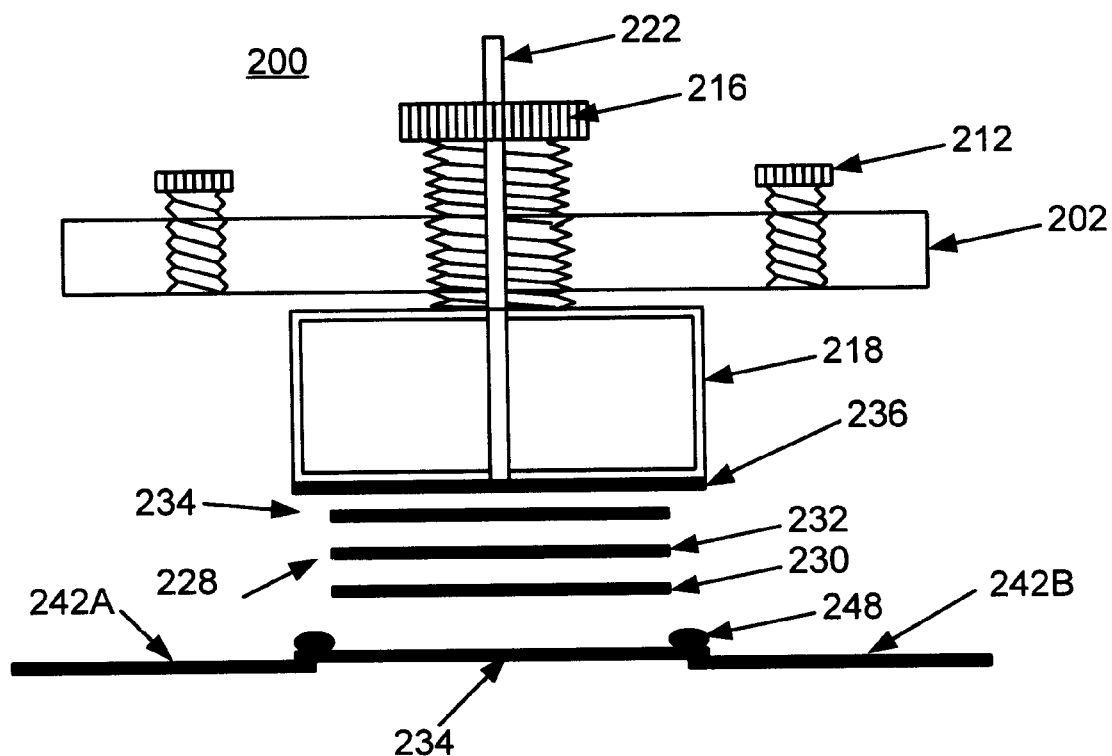
FIG. 9 is a side schematic view of a press assembly for battery components useable in place of the coin cell battery imager in the toroid cavity detector of FIG. 1 (the press assembly shown before the battery components are compressed together)
Figure 10:
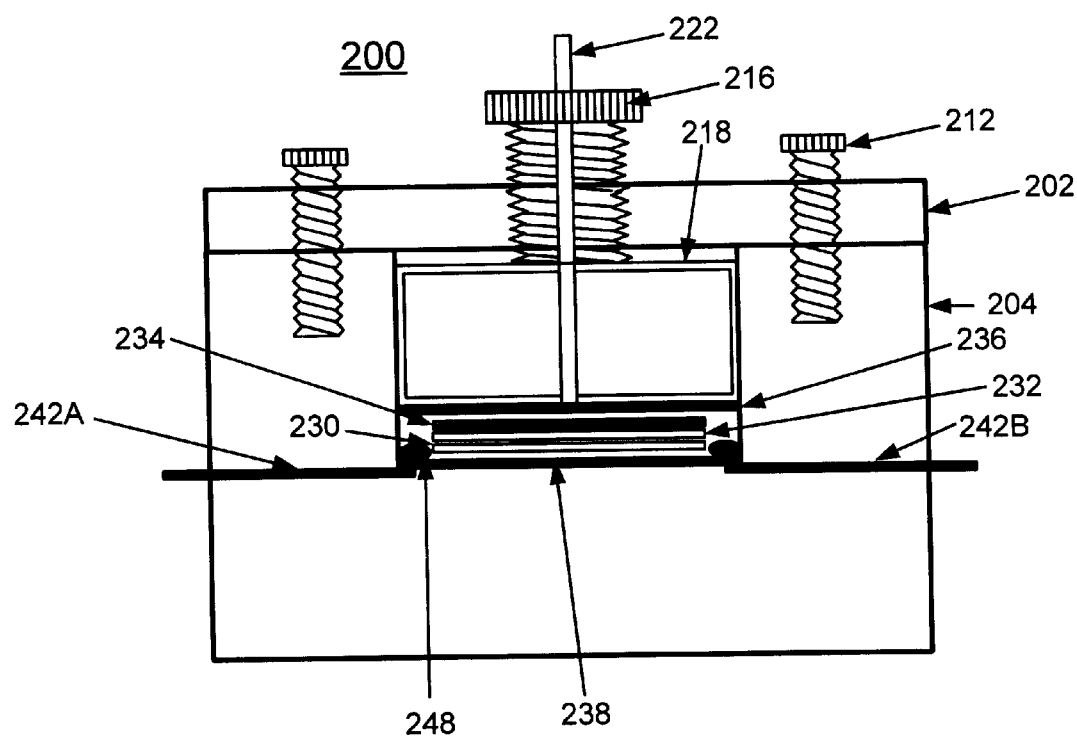
FIG. 10 is a side schematic view of the press assembly of FIG. 9 after the battery components have been compressed together)
Figure 11:
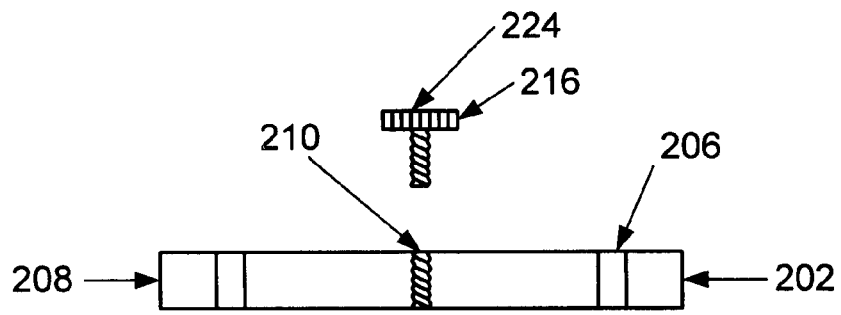
FIG. 11 is a side planar view of the top press component of the press assembly of FIGS. 9 and 10.
Figure 12:
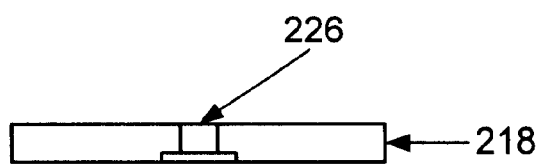
FIG. 12 is a side planar view of the current collector used in the press assembly of FIGS. 9 and 10.

As is illustrated in FIGS. 9–10, the screw 216 engages a non-conductive piston 218 that is located in a circular recess 220 in the bottom press portion 204. A counter electrode wire 222 extends through a central bore 224 in the screw 216 and through a bore 226 in the piston 218 so that it can apply a pressure to coin cell battery components or disks 228 (the components 228 include a carbon electrode 230, a permeable electrical separator 232, an electroactive metal or counter electrode (lithium) 234 and a metallic solid current collector 236) that are disposed in the recess 220 between the piston 218 and a principal detector element 238.

The principal detector element 238 is positioned on a bottom surface 240 of the bottom press portion 204, is generally the same configuration as the principal detector element 54 (i.e., it is a generally circular, flat metal conductor made of copper or the like with its plane generally parallel to the longitudinal axis of the toroid cavity housing 32 in which the principal element detector 238 is disposed), and is coupled to an electrical conductor portion 242A that extends through a hole 244 in the bottom press portion 204 and to another electrical conductor portion 242B that extends through a hole 246 in the bottom press portion 204 (the electrical conductor portions 242A and 242B respectively correspond to the electrical conductor portions 46A and 46B that extend into and through the toroid cavity housing 32 depicted in FIG. 1). In addition to the coin cell battery components 228 disposed in the recess 220, an O-ring 248 of a slightly larger inside diameter than the diameter of the coin cell battery disks 228 is disposed in the recess 220. Once the coin cell battery components 228 and the O-ring 248 are disposed in the recess 220 (as for example shown in FIG. 9 of the drawings), the knurled screw 216 is threaded into the hole 210 such that the piston 218 is forced toward the bottom surface 240 of the recess 220. As is shown in FIG. 10, the movement of the piston 218 toward the bottom surface 240 results in the coin cell battery components 228 being compressed together and the O-ring 248 being compressed between the principal detector element 238 and the current collector 236 such that the coin cell battery components 228 are hermetically sealed between the piston 218 and the principal detector element 238 by the compressed O-ring 248. In view of the fact that the coin cell battery components 228 are so hermetically sealed, an electrolyte can be included with the battery components 228. Advantageously, the counter electrode wire 222 does not extend through the current collector 236 (see FIG. 10) into the area sealed by the O-ring 248 so that this configuration does present any sealing problems. On the other hand in the case of the coin cell battery holder 44, the counter electrode wire 58 does extend through the end cap 60 into the sealed area so it is necessary to ensure that the counter electrode wire 58 is properly sealed in the end cap 60. The O-ring seals the battery components 228 directly to the principal detector element 238 so that the connections of the electrical conductor portions 242A and 242B are outside of the sealed area. This is not the case in the coin cell battery holder 44 so the electrical conductor portions 46A and 46B need to be properly sealed as they extend into the holder 52.

The compression of the battery components 228 in this manner results in the carbon electrode 230 being forced against the principal detector element 238 lodged in the recess 220 of the bottom press portion 204. As indicated above, the carbon electrode 230 is accordingly at a location where the most optimum NMR signal sensitivity is located when the battery components 228 are being analyzed. In this regard, a DC potential can be applied to the components 228 from a potentiostat like the potentiostat 48 illustrated in FIG. 1 of the drawings through the upper electrical conductor 242A, the principal detector element 238 and the counter electrode wire 222. As a result, the battery components 228 can be subjected to charging and discharging by the potentiostat 48 just as they would be during normal operation of the coin cell battery when the magnetic field $B_1$ is being alternately energized and de-energized within the toroid cavity 42. Consequently, the NMR analysis of the battery components 228 takes place while the battery components 228 are in situ and at different dynamic conditions of the battery components 228 as they are being charged or discharged.

Figure 17:
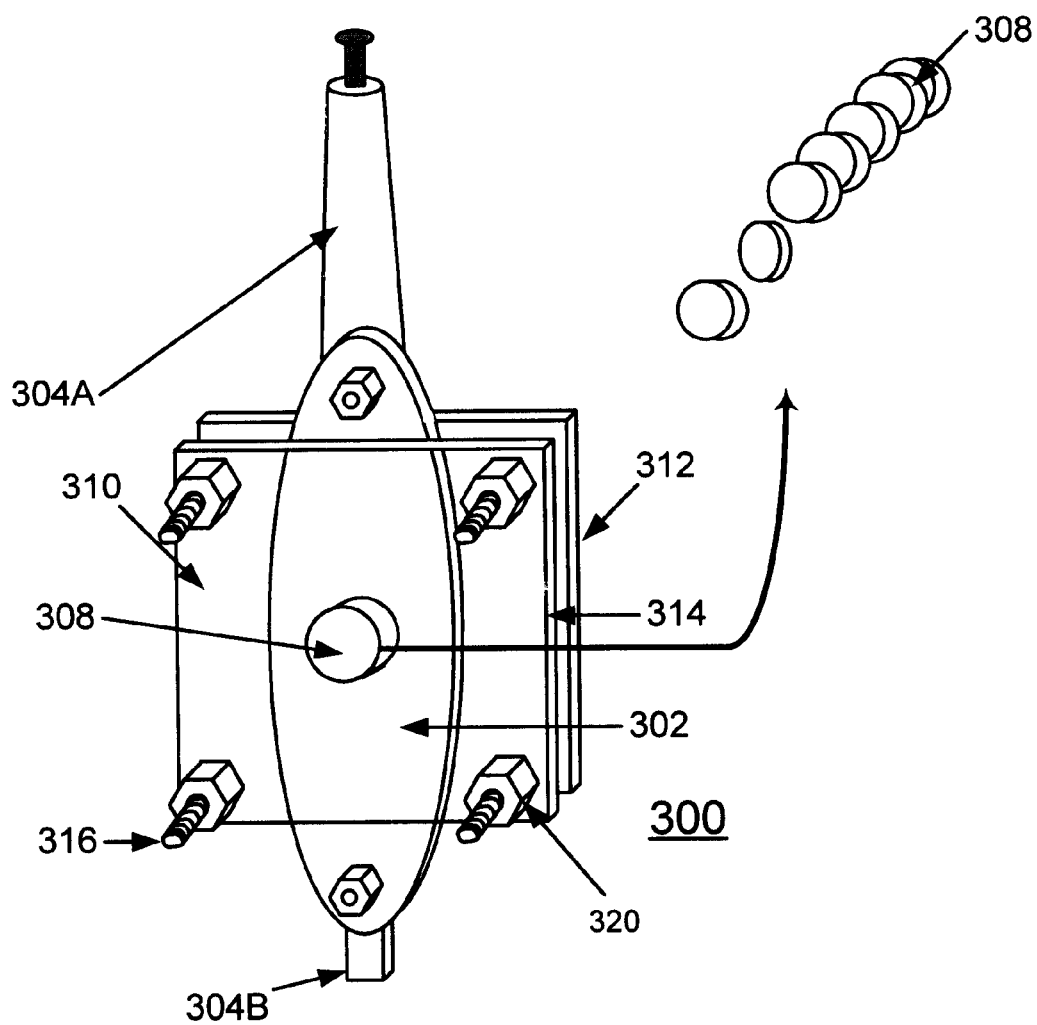
FIG. 17 is a perspective view of alternate holding assembly that can be used in place of the coin cell battery imager in the toroid cavity detector of FIG. 1, the holder assembly including an alternately shaped principal detector element and glass holders for holding samples against the principal detector element.
Figure 18:
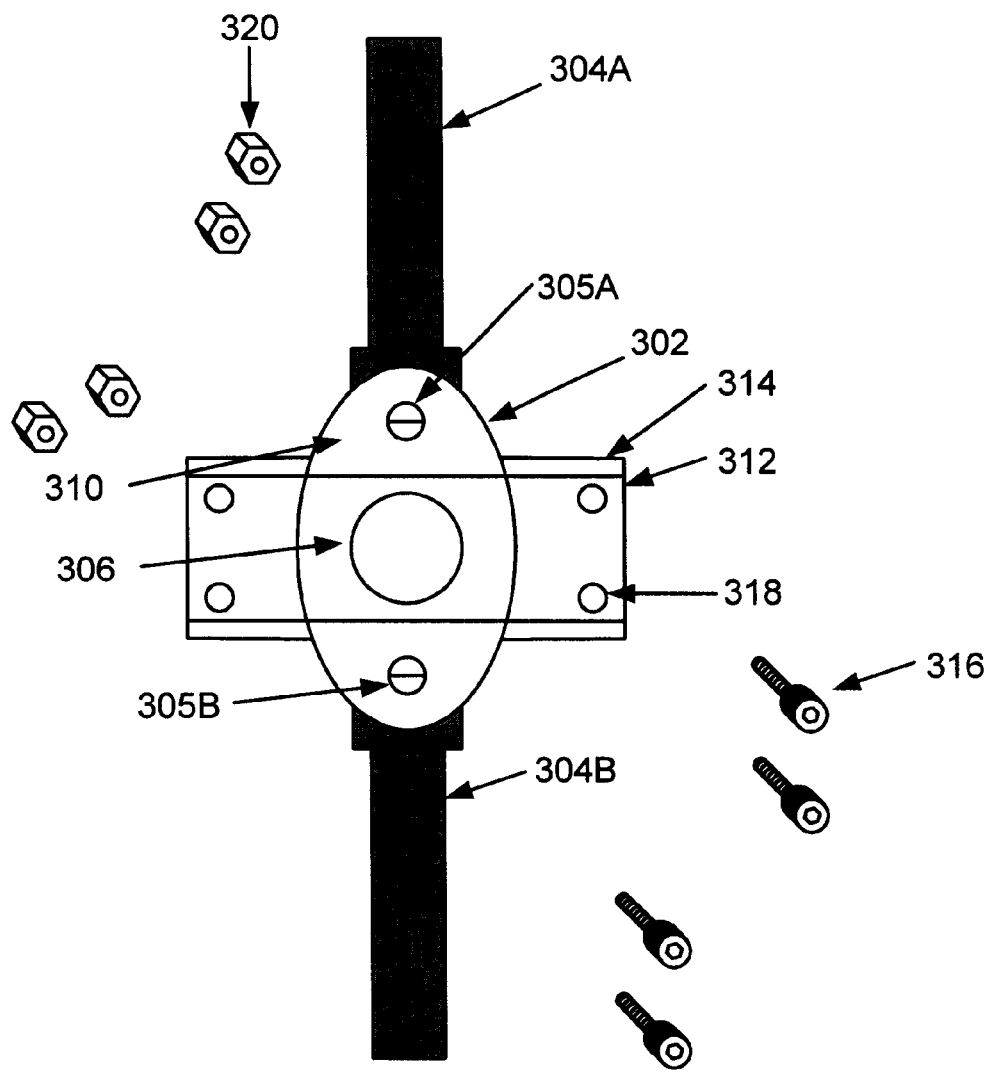
FIG. 18 is a front, partially exploded view of the holding assembly of FIG. 17.

In the case of the coin cell battery holder 44 and the press assembly 200, the components of coin cell batteries were being analyzed by the use of NMR analysis. As a result, the coin cell battery holder 44 and the press assembly 200 were specifically designed and sized for the battery components 64 and 228 respectively. However, it would be advantageous to conduct NMR analysis of other gas, liquid or solid samples in the toroid cavity detector 30 disclosed in FIG. 1 of the drawing particularly in connection with how those samples absorb or fluoresce light (ultraviolet, visible or infrared). In FIGS. 17–18 of the drawings, a sample holder 300 is disclosed that also embodies the present invention. The sample holder 300 is adapted to be mounted in a toroid cavity housing like the housing 32 disclosed in FIG. 1 of the drawings in place of the coin cell battery holder 44 (in such a case, a counter electrode wire like the counter electrode wire 58 would not be necessary because the sample holder 300 would not be used with battery components that are to be charged or discharged).

A principal detector element 302 is used in connection with the sample holder 300. Unlike the principal detector elements 54 and 238, the principal detector element 302 is a generally oval-shaped, flat metal conductor (the principal detector 302 can be other shapes such as circular or square), but like the principal detector elements 54 and 238 has its plane generally parallel to the longitudinal axis of the toroid cavity housing 32 in which the principal element detector 302 is disposed. An electrical conductor portion 304A is secured to one of the ends of the principal detector element 302 by a fastener 305A and an electrical conductor portion 304B is secured to the other end of the principal detector element 302 by a fastener 305B. A sample (gas, liquid, or solid) to be analyzed in the toroid cavity detector 32 is encircled by an O-ring 306. For example, the sample in FIG. 17 is layers of adhesive tape 308. The sample 308 and the O-ring 306 are positioned between one flat side 310 of the principal detector element 302 and a transparent or glass plate 312. Another transparent or glass plate 314 is positioned against a flat side of the principal detector element 302 opposite to the flat side 310. The plates 312 and 314 are compressed towards each other by the tightening of non-conductive screws 316 that extend through aligned holes 318 in the plates 312 and 314 into nonconductive nuts 320. As a result, the sample 308 and the O-ring 306 are compressed against the flat side 310 of the principal detector element 302 and the sample 308 is hermetically sealed between the plate 312 and the principal detector element 302. In view of the fact that the sample is maintained under the plate 312, light (ultraviolet, visible or infrared) can be transmitted through the plate 312 into the sample 308, back-reflected from the principal detector element 302, and transmitted back through the sample 308 so that the light can be viewed or analyzed for absorption or fluorescence.

Figure 19:
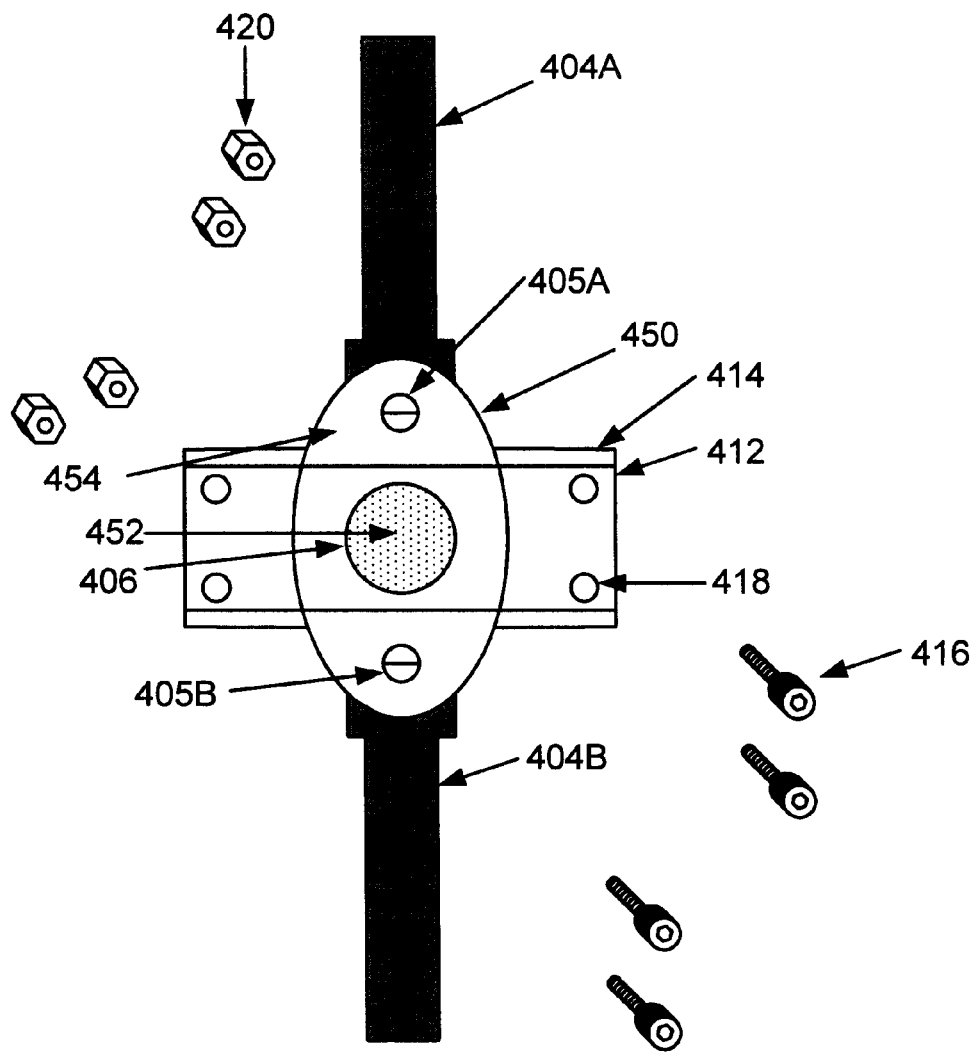
FIG. 19 is a front, partially exploded view of a holding assembly similar to the holding assembly of FIGS. 17–18 but with the principal detector element having holes therethrough so that materials held separated by a semi-permeable membrane can be analyzed.

By using a sample holder similar to sample holder 300, a semi-permeable membrane can be subjected to NMR analysis. Such a sample holder 400 is illustrated in FIG. 19 of the drawings and also embodies the present invention. The sample holder 400 is adapted to be mounted in a toroid cavity housing like the housing 32 disclosed in FIG. 1 of the drawings in place of the coin cell battery holder 44. As indicated, the sample holder 400 is similar to the sample holder 300 disclosed in FIGS. 17–18 of the drawings. Accordingly, the components of the sample holder 400 that are specifically referred to herein are referenced by the same reference numerals as the corresponding components in the sample holder 300 except that the quantity 100 has been added to the reference numerals.

The sample holder 400 includes a principal detector element 450 that is a generally oval-shaped, flat metal conductor (the principal detector 450 can be other shapes such as circular or square), but like the principal detector element 302 has its plane generally parallel to the longitudinal axis of the toroid cavity housing 32 in which the principal detector element 450 is disposed. Unlike the principal detector element 302, the principal detector element 450 has a plurality of holes extending through it. A semi-permeable membrane 452 is positioned against one flat side 454 of the principal detector element 450. A sample (gas, liquid, or solid) encircled by an O-ring 406 is positioned between that semi-permeable membrane 452 and a transparent or glass plate 412. Another semi-permeable membrane is positioned against the opposite flat side of the principal detector element 450. Another sample (gas, liquid, or solid) encircled by an O-ring (not shown) is positioned between that other semi-permeable membrane and another transparent or glass plate 414. The plates 412 and 414 are compressed towards each other by the tightening of nonconductive screws 416 that extend through aligned holes 418 in the plates 412 and 414 into nonconductive nuts 420. As a result, the samples and O-rings on both sides of the principal detector element 450 are compressed against the semi-permeable membranes (such as the semi-permeable membrane 452) on the respective sides of the principal detector element 450. An osmotic pressure can be developed across the semi-permeable membrane 452 so that atoms, molecules, and/or ions pass through the semi-permeable membrane 452 and reach the principal detector element 450. As a result, the material that has passed through the membrane 452 is placed directly at the most sensitive region of the toroid cavity detector, i.e., in close proximity to the principal detector element 450. This material can be analyzed and identified according to its spatial location by an imaging procedure or by a measured signal enhancement.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A sample holder for use in a toroid cavity detector for in-situ analysis of a sample through the use of nuclear magnetic resonance, said detector including a housing which forms a toroid cavity with a longitudinal axis and to which is adapted to be applied an externally applied magnetic field, and including a pulse generator for supplying a pulsed signal to an electrical conductor extending into said toroid cavity and thereby to a principal detector element such that a magnetic field being at least partially oriented perpendicular to said externally applied magnetic field and internal to said toroid cavity is developed when said pulsed signal is supplied to said electrical conductor and said principal detector element, said sample holder comprising:

a nonconductive holder structure for hermetically sealing said sample relative to said principal detector element; and said principal detector element being a generally flat circular metal conductor and said nonconductive holder structure including a principal detector element holder in which said principal detector element is coupled to said electrical conductor; and a compressing portion for hermetically sealing said sample and said principal detector element.

2. A sample holder for use in a toroid cavity detector as set forth in claim 1 wherein said principal detector element holder has a recess in which is disposed said principal detector element and a groove about said recess adapted to receive an O-ring.

3. A sample holder for use in a toroid cavity detector as set forth in claim 2 wherein said compressing portion is a nonconductive end cap having a flange to compress said O-ring.

4. A sample holder for use in a toroid cavity detector as set forth in claim 3 wherein said sample includes components of a coin cell battery hermetically sealed by said O-ring when said compressing portion compresses said O-ring.

5. A sample holder for use in a toroid cavity detector as set forth in claim 4 wherein said components of said coin cell battery include a carbon electrode, a permeable electrical separator, an electroactive metal counter electrode and a current collector.

6. A sample holder for use in a toroid cavity detector as set forth in claim 5 including a counter electrode wire coupled to said current collector so that a direct current potential can be applied to said components of said coin cell battery through said electrical conductor and said counter electrode wire.

7. A sample holder for use in a toroid cavity detector as set forth in claim 1 wherein said principal detector element holder and said compressing portions are generally cylindrical in shape.

8. A sample holder for use in a toroid cavity detector as set forth in claim 1 wherein said principal detector element is a generally flat circular metal conductor and said nonconductive holder includes first and second press portions, said second press portion having a recess in which is disposed said principal detector element, in which said sample is disposed so as to be encircled by an O-ring and in which is disposed a piston, said first press portion having a piston driving mechanism so that said piston compresses said sample and said O-ring against said principal detector element to hermetically seal said sample between said piston and said principal detector element.

9. A sample holder for use in a toroid cavity detector as set forth in claim 8 wherein said sample includes components of a coin cell battery hermetically sealed by said O-ring when said O-ring is compressed by said piston.

10. A sample holder for use in a toroid cavity detector as set forth in claim 9 wherein said components of said coin cell battery include a carbon electrode, a permeable electrical separator, an electroactive metal counter electrode and a current collector.

11. A sample holder for use in a toroid cavity detector as set forth in claim 10 including a counter electrode wire coupled to said current collector through said piston driving mechanism so that a direct current potential can be applied to said components of said coin cell battery through said electrical conductor and said counter electrode wire.

12. A sample holder for use in a toroid cavity detector as set forth in claim 8 wherein said principal detector element is coupled to said electrical conductor within said recess.

13. A sample holder for use in a toroid cavity detector as set forth in claim 1 wherein said principal detector element is a generally flat oval metal conductor and said nonconductive holder includes a first transparent plate on one side of said metal conductor with said sample positioned between said first transparent plate and said metal conductor and a second plate on an opposite side of said metal conductor, said first and second plates being compressed towards each other so that said sample is positioned relative to said metal conductor between said first plate and said metal conductor.

14. A sample holder for use in a toroid cavity detector as set forth in claim 13 including an O-ring encircling said sample and positioned between said first transparent plate and said metal conductor such that said O-ring hermetically seals said sample between said first transparent plate and said metal conductor.

15. A sample holder for use in a toroid cavity detector as set forth in claim 1 wherein said principal detector element is a generally flat oval metal conductor with a plurality of holes extending therethrough and said nonconductive holder includes a first transparent plate on one side of said metal conductor with said sample positioned between said first transparent plate and said metal conductor and a second plate on an opposite side of said metal conductor, said first and second plates being compressed towards each other so that said sample is positioned relative to said metal conductor between said first plate and said metal conductor.

16. A sample holder for use in a toroid cavity detector as set forth in claim 15 including an O-ring encircling said sample and positioned between said first transparent plate and said metal conductor such that said O-ring hermetically seals said sample between said first transparent plate and said metal conductor.

17. A sample holder for use in a toroid cavity detector as set forth in claim 16 wherein said sample is separated from said metal conductor by a semi-permeable membrane.

18. A coin cell battery imager for use in a toroid cavity detector for in-situ analysis of components of a coin cell battery through the use of nuclear magnetic resonance, said detector including a housing which forms a toroid cavity with a longitudinal axis and to which is adapted to be applied an externally applied magnetic field, and including a pulse generator for supplying a pulsed signal to an electrical conductor extending into said toroid cavity and thereby to a principal detector element such that a magnetic field being at least partially oriented perpendicular to said externally applied magnetic field and internal to said toroid cavity is developed when said pulsed signal is supplied to said electrical conductor and said principal detector element, said coin cell battery imager comprising:

a nonconductive principal detector element holder structure having a recess in which is disposed said principal detector element and a groove about said recess adapted to receive an O-ring; and a nonconductive end cap secured to said principal detector element holder structure such that said O-ring is compressed so as to hermetically seal said components within said coin cell battery imager and relative to said principal detector element.

19. A coin cell battery imager as set forth in claim 18 wherein said components of said coin cell battery include a carbon electrode, a permeable electrical separator, an electroactive metal counter electrode and a current collector.

20. A coin cell battery imager as set forth in claim 19 including a counter electrode wire coupled to said current collector so that a direct current potential can be applied to said components of said coin cell battery through said electrical conductor and said counter electrode wire.

21. A coin cell battery imager for use in a toroid cavity detector for in-situ analysis of components of a coin cell battery through the use of nuclear magnetic resonance, said detector including a housing which forms a toroid cavity with a longitudinal axis and to which is adapted to be applied an externally applied magnetic field, and including a pulse generator for supplying a pulsed signal to an electrical conductor extending into said toroid cavity and thereby to a principal detector element such that a magnetic field being at least partially oriented perpendicular to said externally applied magnetic field and internal to said toroid cavity is developed when said pulsed signal is supplied to said electrical conductor and said principal detector element, said coin cell battery imager comprising:

first and second press portions, said second press portion having a recess in which is disposed said principal detector element, in which said component are disposed so as to be encircled by an O-ring and in which is disposed a piston, said first press portion having a piston driving mechanism so that said piston compresses said components and said O-ring against said principal detector element to hermetically seal said components between said piston and said principal detector element.

22. A coin cell battery imager as set forth in claim 21 wherein said components of said coin cell battery include a carbon electrode, a permeable electrical separator, an electroactive metal counter electrode and a current collector and including a counter electrode wire coupled to said current collector through said piston driving mechanism so that a direct current potential can be applied to said components of said coin cell battery through said electrical conductor and said counter electrode wire.

23. A sample holder for use in a toroid cavity detector for in-situ analysis of a sample through the use of nuclear magnetic resonance, said detector including a housing which forms a toroid cavity with a longitudinal axis and to which is adapted to be applied an externally applied magnetic field, and including a pulse generator for supplying a pulsed signal to an electrical conductor extending into said toroid cavity and thereby to a principal detector element such that a magnetic field being at least partially oriented perpendicular to said externally applied magnetic field and internal to said toroid cavity is developed when said pulsed signal is supplied to said electrical conductor and said principal detector element, said sample holder comprising:

a holding plate disposed relative to one side of said metal conductor with said sample positioned between said holding plate and said metal conductor;

a sealing device encircling said sample; and fastening devices to compress said holding plate towards said principal detector element so that said sample is hermetically sealed by said sealing device between said principal detector element and said holding plate.

24. A sample holder for use in a toroid cavity detector as set forth in claim 23 wherein said principal detector element is a generally flat oval metal conductor with a plurality of holes extending therethrough and a semi-permeable membrane separates said sample from said principal detector element.

* * * * *